US012751077B2

(12) United States Patent
Radulescu et al.

(10) Patent No.: US 12,751,077 B2
(45) Date of Patent: Sep. 29, 2026

(54) FLIP-CHIP FIELD EFFECT TRANSISTOR LAYOUTS AND STRUCTURES

(71) Applicant: Wolfspeed, Inc., Durham, NC (US)

(72) Inventors: Fabian Radulescu, Chapel Hill, NC (US); Basim Noori, San Jose, CA (US); Scott Sheppard, Chapel Hill, NC (US); Qianli Mu, San Jose, CA (US); Jeremy Fisher, Raleigh, NC (US); Dan Namishia, Wake Forest, NC (US)

(73) Assignee: Wolfspeed, Inc., Durham, NC (US)

( * ) Notice: Subject to any disclaimer, the term of this patent is extended or adjusted under 35 U.S.C. 154(b) by 768 days.

(21) Appl. No.: 18/105,586

(22) Filed: Feb. 3, 2023

(65) Prior Publication Data

US 2024/0266348 A1 Aug. 8, 2024

(51) Int. Cl.

| | |
|---|---|
| ***H10D 84/82*** | (2025.01) |
| ***H10W 20/43*** | (2026.01) |
| ***H10W 72/20*** | (2026.01) |
| ***H10W 72/90*** | (2026.01) |
| ***H10W 90/00*** | (2026.01) |

(52) U.S. Cl.

CPC ............ *H10D 84/82* (2025.01); *H10W 20/43* (2026.01); *H10W 72/9445* (2026.01); *H10W 72/227* (2026.01); *H10W 72/232* (2026.01); *H10W 72/237* (2026.01); *H10W 72/248* (2026.01); *H10W 72/252* (2026.01); *H10W 72/926* (2026.01); *H10W 90/724* (2026.01)

(58) Field of Classification Search

CPC ........................................................ H10D 84/82

See application file for complete search history.

(56) References Cited

U.S. PATENT DOCUMENTS

| | | | | |
|---|---|---|---|---|
| 5,789,791 | A * | 8/1998 | Bergemont | H10D 64/519 257/920 |
| 8,796,843 | B1 * | 8/2014 | Babic | H10W 76/134 257/718 |
| 9,786,660 | B1 | 10/2017 | Farrell et al. | |
| 2019/0088772 | A1 | 3/2019 | Fayed et al. | |
| 2021/0313284 | A1 * | 10/2021 | Noori | H10W 44/20 |
| 2021/0313286 | A1 * | 10/2021 | Watts | H10W 20/484 |
| 2021/0313935 | A1 * | 10/2021 | Noori | H03F 1/565 |
| 2021/0375856 | A1 | 12/2021 | Alcorn et al. | |
| 2022/0328634 | A1 | 10/2022 | Bothe et al. | |
| 2023/0075505 | A1 * | 3/2023 | Radulescu | H01L 23/4824 |
| 2023/0421117 | A1 * | 12/2023 | DeVita | H10W 44/20 |

* cited by examiner

*Primary Examiner* — William A Harriston

(74) *Attorney, Agent, or Firm* — Sage Patent Group

(57) ABSTRACT

A transistor device includes a substrate and a plurality of transistor unit cells arranged in parallel on the substrate. Each of the transistor unit cells includes a source contact, a drain contact, and a gate finger between the source contact and the drain contact. The gate finger extends in a first direction and has a first end and a second end. The transistor device further includes a first solder bump on the transistor device that is within a periphery of the active region of the device and is electrically connected to the gate finger of a first one of the unit cells at a feed point that is between the first end and the second end of the gate finger.

7 Claims, 10 Drawing Sheets

FLIP-CHIP FIELD EFFECT TRANSISTOR LAYOUTS AND STRUCTURES

BACKGROUND

The present disclosure relates to transistor structures and in particular to field effect transistors.

Narrow bandgap semiconductor materials, such as silicon (Si) and gallium arsenide (GaAs), are widely used in semiconductor devices for low power and, in the case of Si, low frequency applications. However, these semiconductor materials may not be well-suited for high power and/or high frequency applications, for example, due to their relatively small bandgaps (1.12 eV for Si and 1.42 for GaAs at room temperature) and relatively small breakdown voltages.

Interest in high power, high temperature and/or high frequency applications and devices has focused on wide bandgap semiconductor materials such as silicon carbide (SiC) and the Group III nitrides, such as gallium nitride (GaN). For example, 4H-SiC has a bandgap of 3.2 eV at room temperature, while GaN has a bandgap of 3.36 eV at room temperature. These materials may have higher electric field breakdown strengths and higher electron saturation velocities than GaAs and Si.

Transistors fabricated in the SiC and/or GaN material systems can handle large amounts of RF power and/or high voltages due to a combination of material characteristics, such as relatively high breakdown fields, relatively wide bandgaps, relatively large conduction band offsets, and/or relatively high saturated electron drift velocities.

A device of particular interest for high power and/or high frequency applications is the High Electron Mobility Transistor (HEMT), which is also known as a modulation doped field effect transistor (MODFET). In a HEMT device, a two-dimensional electron gas (2DEG) may be formed at the heterojunction of two semiconductor materials with different bandgap energies, where the smaller bandgap material has a higher electron affinity than the wider bandgap material. The 2DEG is an accumulation layer in the undoped smaller bandgap material and can contain a relatively high sheet electron concentration, for example, in excess of $10^{13}$ carriers/cm$^2$. Additionally, electrons that originate in the wider bandgap semiconductor may transfer to the 2DEG, allowing a relatively high electron mobility due to reduced ionized impurity scattering. This combination of relatively high carrier concentration and carrier mobility can give the HEMT a relatively large transconductance.

Wide bandgap semiconductor materials such as silicon carbide (SIC) and gallium nitride (GaN) are also being investigated for use in other high power/high frequency transistor structures, such as metal-oxide semiconductor field effect devices (MOSFETs) and metal-semiconductor field effect transistors (MESFETS).

Referring to FIG. 1A, a GaN transistor device is typically packaged by mounting a transistor device (or die) 10 on a submount 12 using a die attach material 14 and forming wire bonds 16 from the transistor device 10 to bond pad regions 18 on the submount 12. A mold cap 22 may be formed over the device 10 and the submount 12. The submount 12 may be mounted, for example to a printed circuit board (PCB), via solder balls 20 on the underside of the submount 12.

A transistor die may also have a so-called flip-chip configuration in which bond pads and solder bumps are formed on the top side of the die, and the die is mounted upside-down on a submount. For example, FIG. 1B illustrates a device 10' on which a plurality of bond pads 26 and solder bumps 28 are formed on a top side thereof. The device 10' is flip-mounted onto a submount 32 so that the solder bumps 28 contact bond pad regions 29 on the submount 32. An epoxy undefill 24 fills spaces between the device 10' and the submount 32 around the solder bumps 28. A mold cap 22 is formed over the device 10' and the submount 32. As can be seen in FIG. 1B, no wirebonds may be needed to connect the device 10' to the bond pad regions 29.

A layout of a conventional transistor device 10 is shown in FIG. 2. The device 10 includes a plurality of unit cells 45 arranged in parallel. Each of the unit cells 45 includes a gate finger 42 between a source region 44 and a drain region 46. The spaces between the source regions 44 and the drain regions 46 where the gate fingers 42 are formed define the channel length of the transistor device 10. Thus, the gate fingers 42 are narrow relative to the source regions 44 and drain regions 46.

As shown in FIG. 2, the device 10 includes a plurality of gate pads 52 that receive an input signal and propagate the input signal to the plurality of gate fingers 42 via gate connection structures 43. The device 10 further includes a plurality of drain pads 54 from which the output signal of the transistor device 10 is drawn. The source regions 44 are conductively connected to a source contact pad on the substrate of the device 10 via source connection vias 55. Accordingly, as illustrated by the arrow 60 in FIG. 2, the propagation path of the input signal is from the gate pads 52 towards the distal ends of the gate fingers 42. Because the input signal that is input to the gate pads 52 must traverse the gate connection structures 43 and the entire length of the narrow gate fingers 42, the gate resistance of the device 10 may adversely affect the performance of the device.

SUMMARY

A transistor device according to some embodiments includes a substrate and a plurality of transistor unit cells arranged in parallel on the substrate. Each of the transistor unit cells includes a source contact, a drain contact, and a gate finger between the source contact and the drain contact. The gate finger extends in a first direction and has a first end and a second end. The source contacts, the drain contacts and the gate fingers of the plurality of unit cells define an active region of the transistor device in a portion of the substrate where the source contacts, the drain contacts and the gate fingers overlap in the first direction. The transistor device further includes a first solder bump on the transistor device, wherein the first solder bump is within a periphery of the active region and is electrically connected to the gate finger of a first one of the unit cells at a feed point that is between the first end and the second end of the gate finger.

The transistor device may further include a source contact pad on the substrate adjacent a first side of the active region, a drain contact pad on the substrate adjacent a second side the active region opposite the first side of the active region, a second solder bump on the source contact pad, and a third solder bump on the drain contact pad.

The first solder bump may be connected to the gate finger via a first metal interconnect layer between the gate finger and the first solder bump.

The first solder bump may be connected to a plurality of gate fingers via a second metal interconnect layer that may be between the first metal interconnect layer and the second metal interconnect layer.

The transistor device may further include a first plurality of solder bumps on the transistor device, wherein the first plurality of solder bumps are within the periphery of the active region and are electrically connected to gate fingers of respective ones of the plurality of transistor unit cells.

The first solder bump may be directly above the gate finger.

The transistor device may be configured to be flip-chip mounted to a submount having a contact bond pad region that contacts the first solder bump.

An input signal may be propagated along the contact bond pad region to the first solder bump in a second direction that may be perpendicular to the first direction.

A transistor device according to some embodiments includes a substrate and a plurality of transistor unit cells arranged in parallel on the substrate. Each of the transistor unit cells includes a source contact, a drain contact, and a gate finger between the source contact and the drain contact, wherein the gate finger extends in a first direction. The source contacts, the drain contacts and the gate fingers of the plurality of unit cells define an active region of the transistor device in a portion of the substrate where the source contacts, the drain contacts and the gate fingers overlap in the first direction. A plurality of gate contact pads are connected to the gate fingers, a plurality of drain contact pads are connected to the drain contacts, and a plurality of source contact pads are connected to the source contacts.

The gate contact pads and a first plurality of the source contact pads are arranged alternatingly in a first ground-signal-ground (GSG) arrangement on a first side of the active region, and the drain contact pads and a second plurality of the source contact pads are arranged alternatingly in a second GSG arrangement on a second side of the active region opposite the first side of the active region.

The gate contact pads, source contact pads and drain contact pads may be provided outside the active region of the transistor device.

The transistor device may further include a first plurality of solder bumps on the gate contact pads, a second plurality of solder bumps on the source contact pads, and a third plurality of solder bumps on the drain contact pads.

Each gate contact pad may be connected to a plurality of gate fingers.

The transistor device may further include a gate strap between the gate contact pads and the active region, wherein at least two of the gate contact pads are connected to the gate strap, and wherein a plurality of the gate fingers are connected to the gate strap.

The gate strap may cross over or under the first plurality of source contact pads and may be electrically insulated from the first plurality of source contact pads.

The active region may be a first active region, and the transistor device may further include a second active region adjacent the first active region, wherein the gate contact pads and the first plurality of source contact pads are provided within a space between the first active region and the second active region.

The second active region may include a second plurality of transistor unit cells arranged in parallel on the substrate, and each of the second plurality of transistor unit cells may include a source contact, a drain contact, and a gate finger between the source contact and the drain contact, wherein the gate finger extends in the first direction. The source contacts, the drain contacts and the gate fingers of the second plurality of unit cells define the second active region of the transistor device in a portion of the substrate where the source contacts, the drain contacts and the gate fingers overlap in the first direction.

The transistor device may further include a gate strap in the space between the first active region and the second active region, wherein the gate contact pads are connected to, or form a part of, the gate strap, and wherein a plurality of the gate fingers are connected to the gate strap.

Some embodiments provide a unit cell of a transistor device. The unit cell has a metallization layout including outer source contacts extending in a first direction from a first side of the layout to a second side of the layout opposite the first side of the layout, an inner source contact extending in the first direction, a first drain contact between a first one of the outer source contacts and the inner source contact, a second drain contact between a second one of the outer source contacts and the inner source contact, a source strap that conductively connects the outer source contacts and the inner source contact, a plurality of gate fingers extending in the first direction, wherein each gate finger is provided between one of the drain contacts and one of the outer source contacts or the inner source contact, a gate contact pad on the first side of the layout, wherein the gate contact pad is conductively connected to the gate fingers, and a drain contact pad on the second side, wherein the drain contact is conductively connected to the drain contacts.

The unit cell may further include a first solder bump on the gate contact pad, a second solder bump on the drain contact pad, and a third solder bump on the at least one of the outer source contacts.

Some embodiments provide a transistor device layout including a plurality of unit cells that are arranged in parallel to form an active region.

A transistor device layout according to some embodiments includes a first plurality of unit cells that are arranged in parallel to form a first active region and a second plurality of unit cells that are arranged in parallel to form a second active region. The second active region may be arranged adjacent to the first active region. The first plurality of unit cells and the second plurality of unit cells share a common set of contact pads in a space between the first active region and the second active region.

The common set of contact pads may include gate contact pads, and the common set of contact pads may include drain contact pads.

DETAILED DESCRIPTION OF EMBODIMENTS

Embodiments of the inventive concepts will now be described in connection with the accompanying drawings.

Figure 1A:
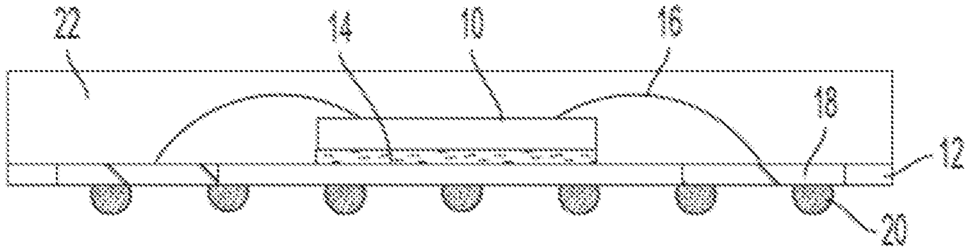
FIGS. 1A and 1B are cross sections of conventionally packaged and flip-chip packaged electronic devices.
Figure 1B:
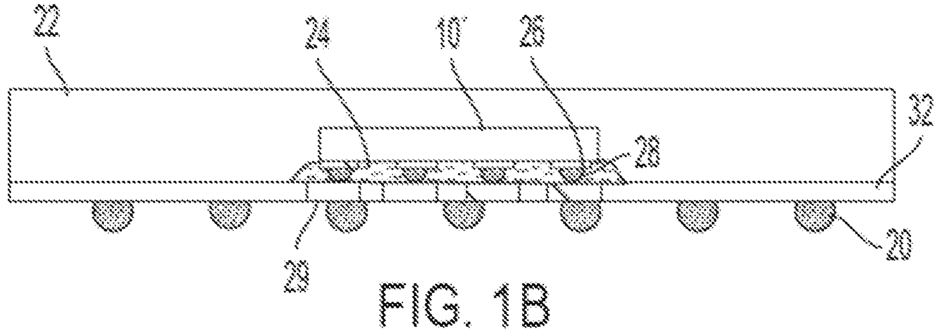
Figure 2:
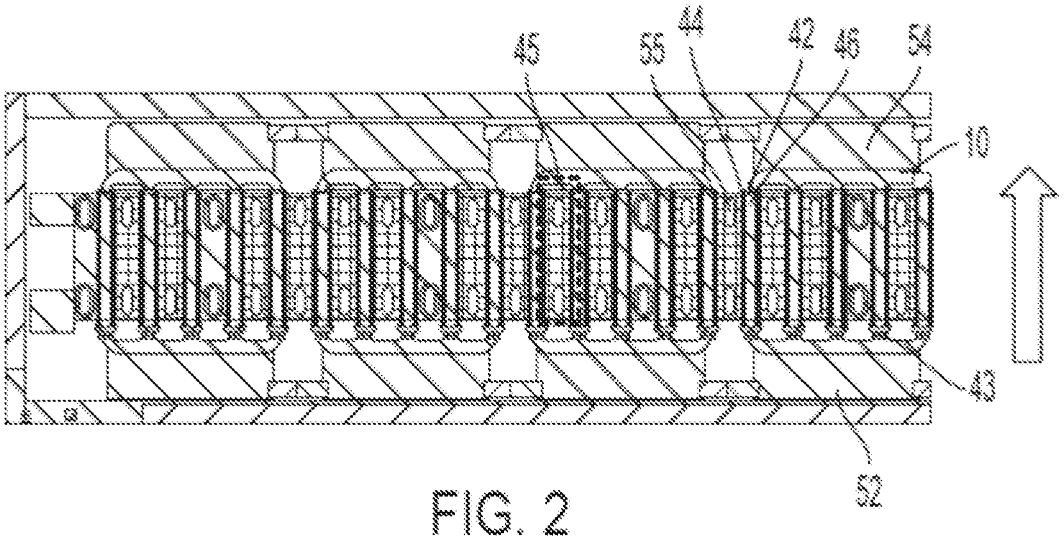
FIG. 2 is a plan view layout of a conventional microwave transistor device.

As illustrated in FIG. 2, in a typical transistor layout, the input signal propagation takes place along the gate width from one side of the die to the opposite side, which is a limitation of the wirebond technology used in non-flip-chip packaging. Some embodiments described herein are based on a realization that flip-chip packaging technology enables new topologies that can route the input signal through lower resistance paths which may reduce the parasitic gate resistance of the transistor. In particular, the input signal can be routed through lower resistance paths by including bump/pillar structures within the periphery of the active area of the device.

Figure 3A:
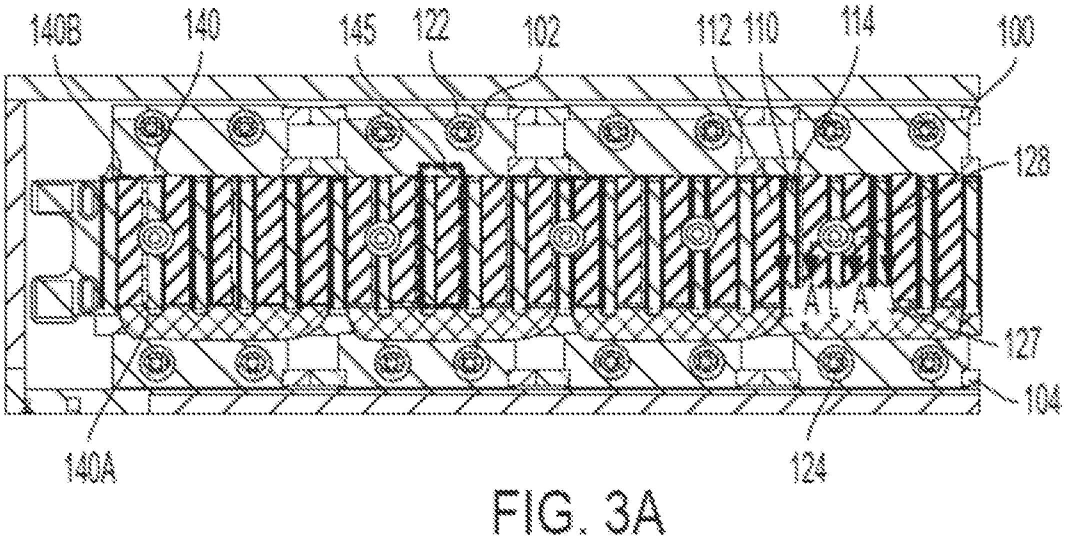
FIGS. 3A and 3B are plan view layouts of flip-chip microwave transistor devices according to some embodiments.
Figure 4:
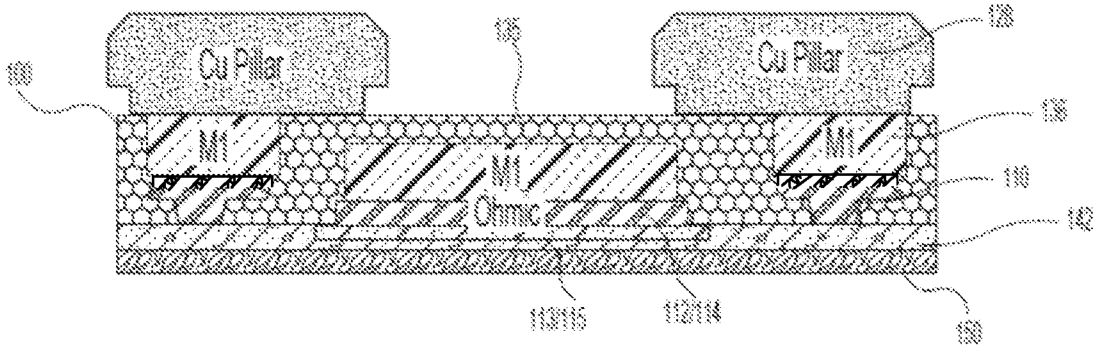
FIG. 4 is a cross sectional view of a portion of a flip-chip microwave transistor device according to some embodiments.

A device layout for a transistor device 100 according to some embodiments is illustrated in FIG. 3A. The transistor device may, for example, be a HEMT, MOSFET, MESFET or other type of transistor device. As shown in FIG. 3A, the transistor device 100 includes a plurality of unit cells 145 arranged in parallel within an active region 140 of the transistor device 100. Each of the unit cells 145 includes a gate finger 110 between a source contact 112 and a drain contact 114, which contact respective source regions 113 and drain regions 115 (FIG. 4). The spaces between the source regions 113 and the drain regions 115 where the gate fingers 110 are formed define the channel length of the transistor device 100.

As further shown in FIG. 3A, the transistor device 100 includes a plurality of source contact pads 104 on a first side 140A of the active region 140 to which the input signal of the transistor device 100 is applied, and a plurality of drain contact pads 102 on a second side 140B of the active region 140 from which the output signal of the transistor device 100 is drawn. The drain contact pads 102 are conductively connected to the drain contacts 114. The source contacts 112 are conductively connected to source contact pads 104 via metal source connectors 127.

The active region 140 of the device, which is the region in the semiconductor device where the current flow through the device is controlled, modulated, and/or activated, is defined by the location where the source contacts 112, gate fingers 110 and drain contacts 114 overlap in the vertical direction (i.e. in a direction perpendicular to current flow from the source regions 112 to the drain contacts 114).

To facilitate flip-chip bonding of the transistor device 100 to a submount, a plurality of solder bumps 122, 124, 128 are formed on the structure to contact and provide electrical connection to various portions of the transistor device 100. For example, a plurality of solder bumps 122 are formed on the drain contact pads 102, and a plurality of solder bumps 124 are formed on the source contact pads 104.

Figure 3B:
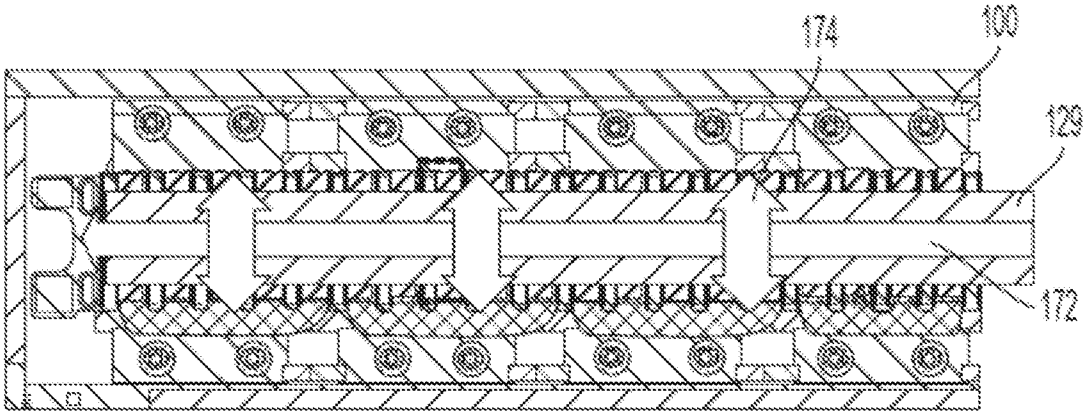

The transistor device 100 also includes a plurality of solder bumps 128 which are formed within the periphery of the active region 140 of the device, and which electrically contact the gate fingers 110 of the transistor device 100. Accordingly, the input signal of the device is input to the gate fingers 110 within the periphery of the active region 140 of the device 100 rather than at an edge of the active region 140. For ease of illustration, only four solder bumps 128 are illustrated in FIG. 3B. However, it will be appreciated that in some embodiments, the transistor device 100 may include one solder bump 128 per gate finger 110 or pair or group of gate fingers 110.

FIG. 3B illustrates a propagation path of the input signal when the transistor device is flip-chip mounted onto a submount including a contact bond pad region 129 that acts as a gate strap to carry the input signal to the gate fingers 110. As shown in FIG. 3B, the input signal travels laterally 172 along the contact bond pad region 129. The input signal is coupled to the gate fingers 110 via the solder bumps 128, and then travels vertically 174 through the gate fingers 110 towards the distal ends of the gate fingers 110.

Because the solder bumps 128 are formed within the periphery of the active region 140, the input signal is applied to the gate fingers 110 at a point that is between the distal ends of the gate fingers 110. Thus, the input signal does not have to travel through the entire length of the gate fingers 110 to reach the ends of the gate fingers 110. This may reduce the parasitic input resistance of the device structure 100.

Figure 3C:
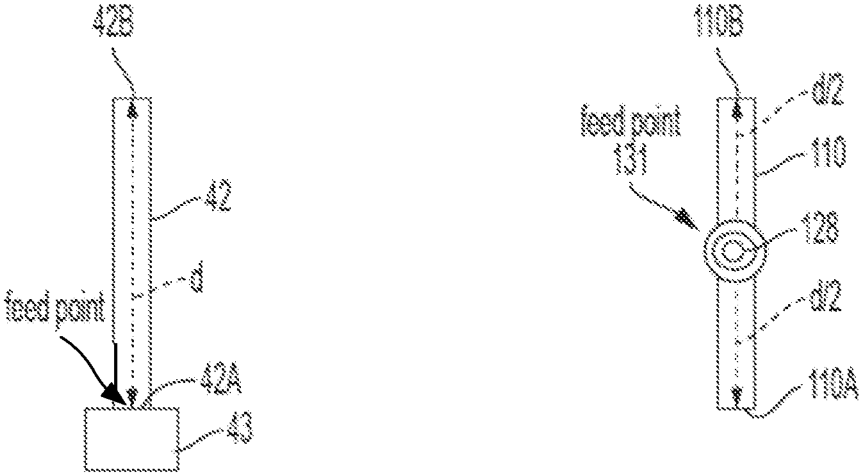
FIG. 3C illustrates conventional gate feed structures and gate feed structures for microwave devices according to some embodiments.

This is illustrated in FIG. 3C, which shows a conventional gate finger 42 that is fed at one end 42A with an input signal through a gate connection structure 43. The input signal must travel the entire length d of the gate finger to reach the distal end 44B of the gate finger. In contrast, in a device structure 100 according to some embodiments, the input signal is fed to the gate finger 110 via a solder bump 128 at a feed point 131 that is between the ends 110A, 110B of the gate finger 110 within the periphery of the active region 140 of the device 100. Thus, the input signal needs to travel less than the entire length d of the gate finger 110 to reach an end 110A, 110B.

For example, when the solder bump 128 contacts the gate finger 110 at a feed point 131 that is mid-way between the ends 110A, 110B, the input signal only needs to travel a distance d/2 to reach an end 110A, 110B. As is known in the art, the resistance of a conductive region is given by the formula µl/A, where p is the resistivity of the region, l is the length of the region and A is the cross-sectional area of the region. The resistance of the region is therefore directly proportional to the length/of the region. By requiring the input signal to traverse a smaller distance from the feed point 131 to the end 110A, 110B of the gate finger 110, the parasitic gate resistance of the device may be reduced proportionately.

FIG. 4 is a cross-sectional illustration of a structure of the solder bumps 128 according to some embodiments taken along line A-A' of FIG. 3A. As shown therein, in some embodiments, the solder bumps 128 comprise metal pillars that contact metal interconnect layers 136 of the device 100. The solder bumps 128 may include a metal with a high electrical conductivity, such as copper. The solder bumps may be provided with other metal layers, such barrier layers and/or bonding layers (not shown) to facilitate flip-chip bonding to a submount.

The transistor device 100 includes a substrate 150 on which an epitaxial region 142 is formed. A source/drain region 113/115 is formed in the epitaxial region 140. Gate fingers 110, which may have a T-top or mushroom shape, are formed on the epitaxial region 142 in a channel region adjacent the source/drain region 113/115. A source/drain contact 112/114 is formed on the source/drain region 113/115. One or more metal interconnect layers 136 provide electrical contact to the ohmic contact 112/114 and the gate finger 110. The epitaxial region 142 is covered by a dielectric passivation layer 135 for protection.

The solder bump 128 is formed on the dielectric passivation layer 135 and electrically contacts the metal interconnect layer 136 to provide electrical contact to the gate finger 110. In the example illustrated in FIG. 4, one solder bump 128 is provided for each gate finger 110. In some embodiments, multiple solder bumps 128 may be provided per gate finger 110.

Figure 5:
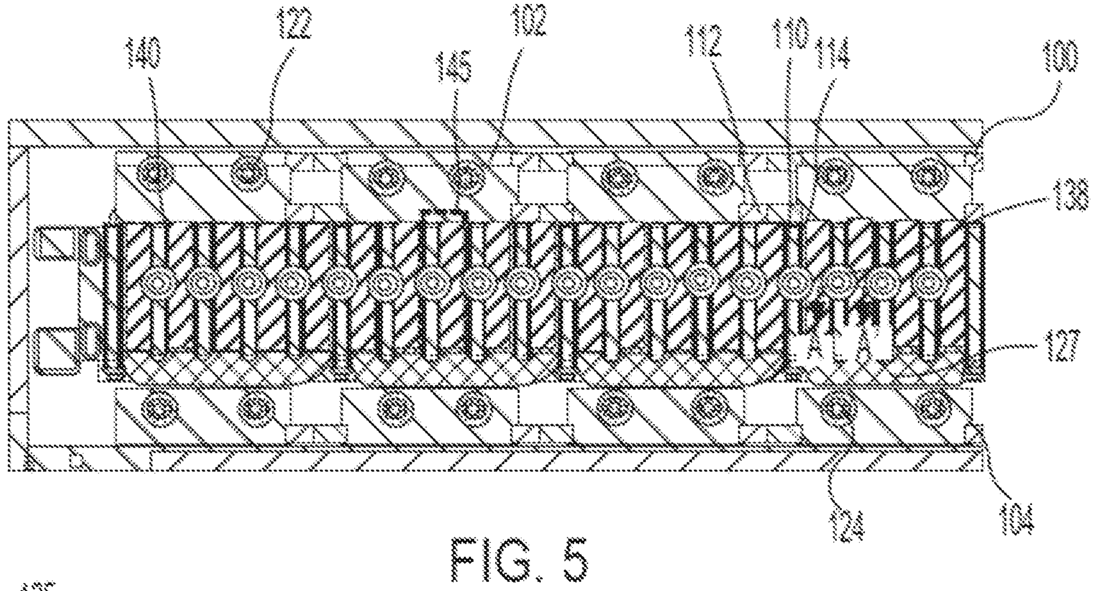
FIG. 5 is a plan view layout of a flip-chip microwave transistor device according to some embodiments.
Figure 6:
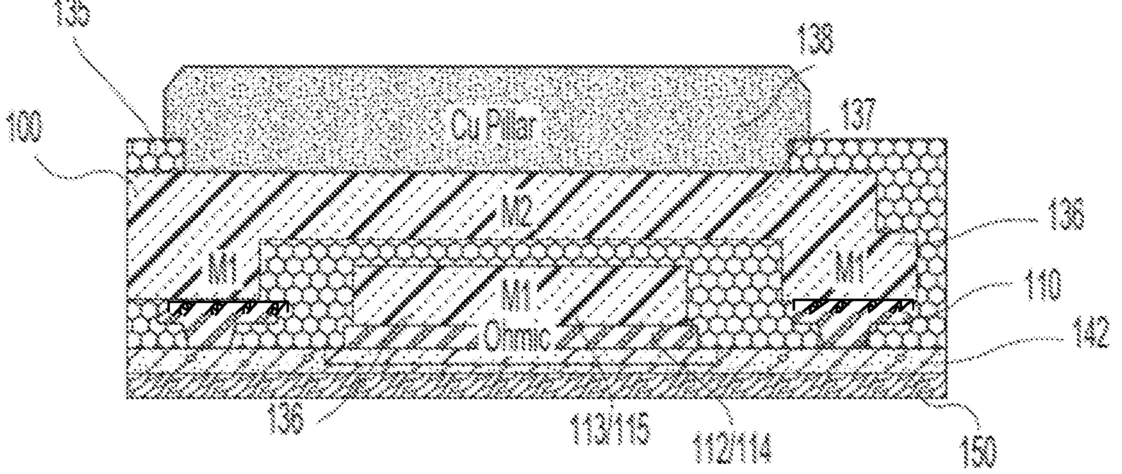
FIG. 6 is a cross sectional view of a portion of a flip-chip microwave transistor device according to some embodiments.

FIGS. 5 and 6 illustrate an embodiment in which a solder bump 138 is conductively connected to a plurality of gate fingers 110 within the periphery of the active region 140 via a second metal interconnect layer 137. In particular, in the embodiment illustrated in FIGS. 5 and 6, a second metal interconnect layer 137 is provided above the first metal interconnect layer 136. The second metal interconnect layer 137 crosses over the source/drain contact 112/114 and contacts two gate fingers 110 on opposite sides of the source/drain contact 112/114 through the first metal interconnect layer 136.

In some embodiments, one solder bump 138 may be provided for each pair of gate fingers 110 on opposite sides of a respective drain contact 114. In some embodiments, one solder bump may connect to more than two gate fingers 110 through second metal interconnect layer 137. That is, the second metal interconnect layer 137 may extend across multiple unit cells of the transistor device 100, and the solder bump 138 that is conductively connected to the second metal interconnect layer 137 may be conductively connected to multiple gate fingers 110.

Because the solder bumps 138 are formed within the periphery of the active region 140, the input signal is applied to the gate fingers 110 at a point that is between the distal ends of the gate fingers 110. Thus, the input signal does not have to travel through the entire length of the gate fingers 110 to reach the ends of the gate fingers 110. This may reduce the parasitic input resistance of the device 100.

Figure 7:
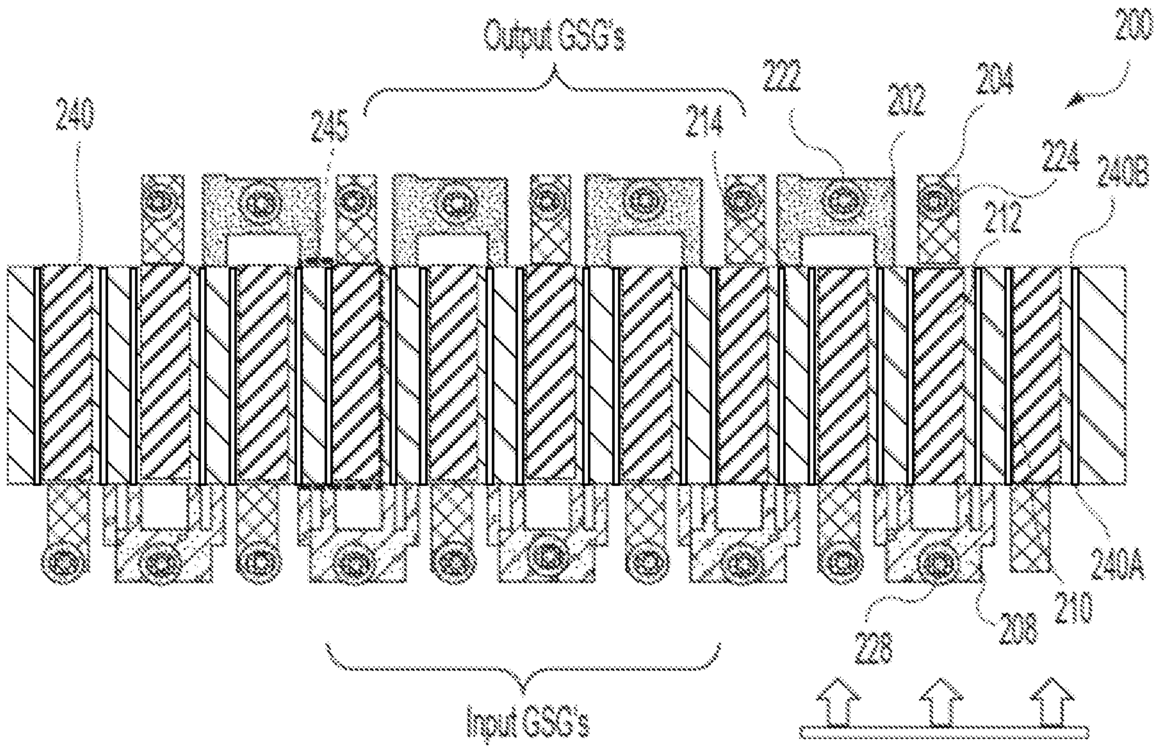
FIGS. 7 to 15 are plan view metallization layouts of flip-chip microwave transistor structures according to various further embodiments.

Some embodiments provide flip-chip devices that have alternating ground and signal connections to a submount via solder bumps. By alternating ground and signal connections, interference that may be caused by the proximity of gate and drain contacts may be reduced. In some embodiments, solder bumps may be conductively connected to gate, source and drain contact pads that are provided outside the active region of the device. For example, referring to FIG. 7, a metallization layout 200 of a transistor device structure including a plurality of unit cells 245 is illustrated. The metallization layout 200 shown in FIG. 7 may be formed on a substrate 150 having a transistor device structure therein as illustrated, for example, in FIG. 4. The metallization layout 200 has a so-called ground-signal-ground (GSG) arrangement of contact pads in which contact pads that carry signals (e.g., the gate contact pads 208 and drain contact pads 202) alternate with contact pads that are conductively connected to ground (e.g., the source contact pads 204) along opposite sides 240A, 240B of the active region 240.

The gate contact pads 208 contact gate fingers 210. The drain contact pads 202 are conductively connected to drain contacts 214, and the source contact pads 204 are conductively connected to source contacts 212. Solder bumps 228 are formed on the gate contact pads 208, solder bumps 224 are formed on the source contact pads 204, and solder bumps 222 are formed on the drain contact pads 202. Source contact pads 204 may be provided to contact the source contacts 212 alternatingly on the first side 240A of the active region 240 and the second side 240B of the active region 240 so that ground contacts (e.g., the source contact pads 204) can be provided on both sides of the active region 240 to enable a GSG arrangement on both sides of the device.

The gate contact pads 208 and the drain contact pads 202 are provided on opposite sides of the active region 240, which may help to reduce interference between the input and output signals. In the embodiment illustrated in FIG. 7, each gate contact pad 208 connects to four gate fingers 210.

Figure 8:
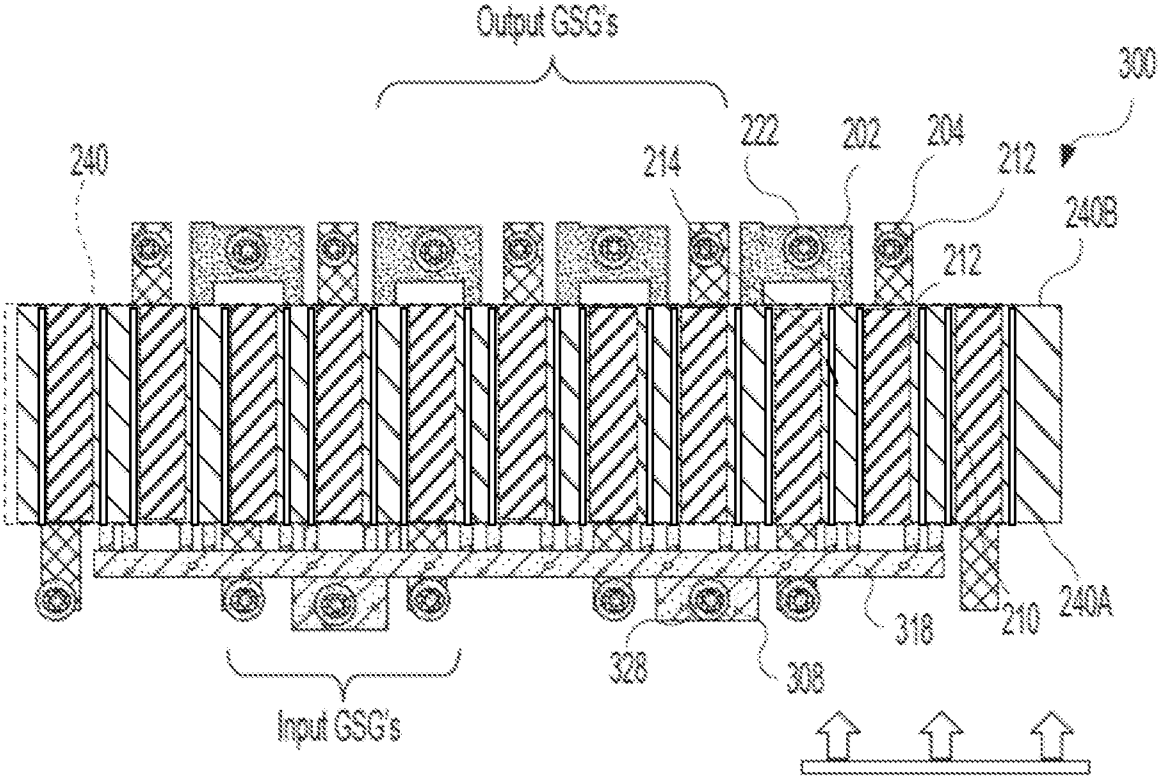

A metallization layout 300 of a transistor device structure according to further embodiments is illustrated in FIG. 8. The metallization layout 300 shown in FIG. 8 may be formed on a substrate 150 having a transistor device structure therein as illustrated, for example, in FIG. 4. Referring to FIG. 8, in some embodiments, gate contact pads 308 are conductively connected to a gate strap 318 that crosses over or under one or more of the source contact pads 204 to feed a plurality of gate fingers 210. The gate strap 318 may be insulated from the source contact pads 204 for example, by an insulation layer (not shown) that may be provided between the gate strap 318 and the source contact pads 204.

Solder bumps 328 are provided on the gate contact pads 308. On a first side 240A of the active region 240, the gate contact pads 308 and source contact pads 204 may be arranged in an alternating fashion to provide a GSG arrangement. Likewise, on the opposite side 240B of the active region 240, the drain contact pads 202 and source contact pads 204 may be arranged in an alternating fashion to provide a GSG arrangement. Source contact pads 204 may be provided to contact the source contacts 212 alternatingly on the first side 240A of the active region 240 and the second side 240B of the active region 240 so that ground contacts (e.g., the source contact pads 204) can be provided on both sides of the active region 240 to enable a GSG arrangement on both sides of the device.

Figure 9:
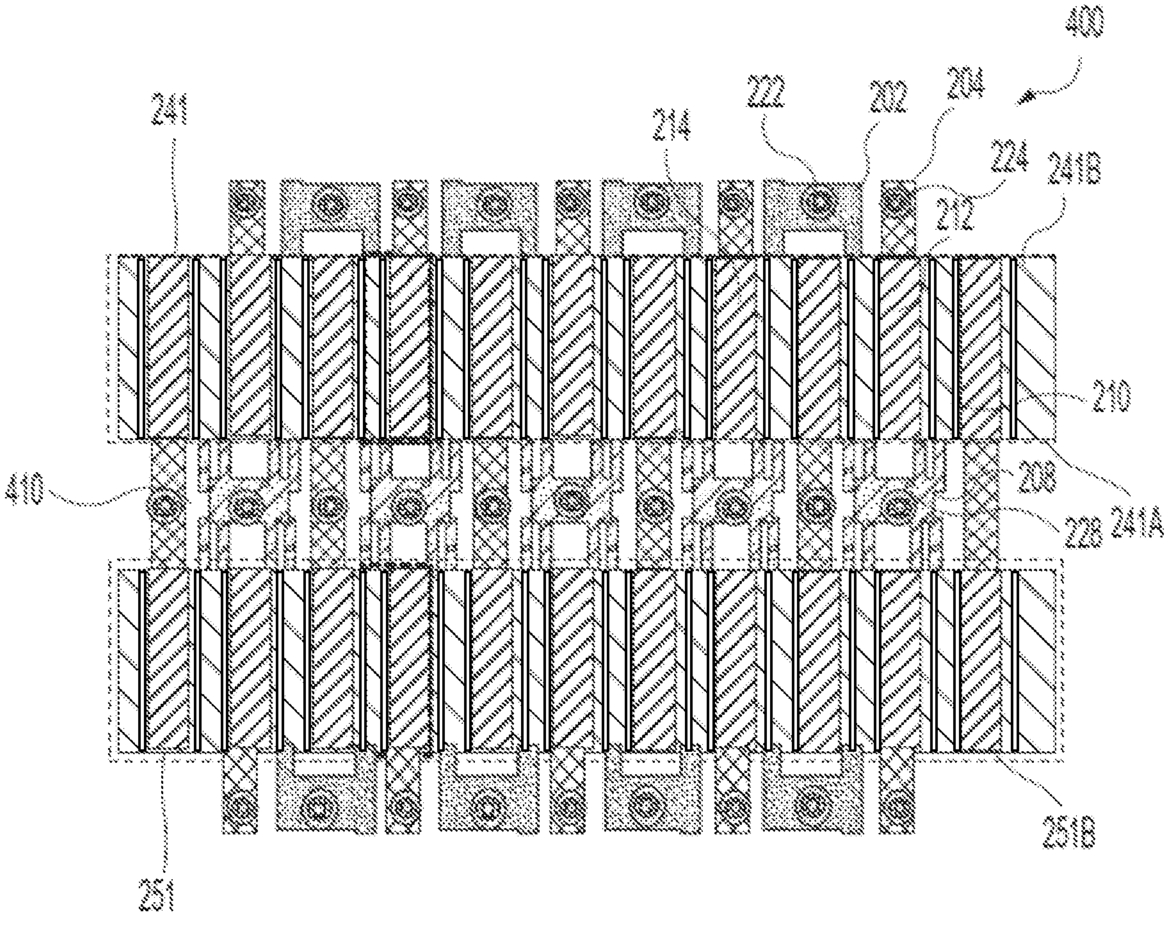

A metallization layout 400 of a transistor device structure according to further embodiments is illustrated in FIG. 9. The metallization layout 400 shown in FIG. 9 may be formed on a substrate 150 having a transistor device structure therein as illustrated, for example, in FIG. 4. Referring to FIG. 9, in some embodiments, the active region is split into an upper active region 241 and a lower active region 251. The upper active region 241 and the lower active region 251 are spaced apart in a vertical direction, and one or more gate contact pads 208 are disposed within a space 410 between the upper active region 241 and the lower active region 251. Drain contact pads 202 and source contact pads 204 are disposed alternatingly along outer an outer edge 241B of the upper active region 241 and a lower edge 251B of the lower active region 251 in a GSG arrangement.

Solder bumps 224 are formed on the source contact pads 204 and solder bumps 222 are formed on the drain contact pads 202. The solder bumps 222 and the solder bumps 224 are arranged alternatingly along outer the outer edge 241B of the upper active region 241 and the lower edge 251B of the lower active region 251 in a GSG arrangement.

Within the space 410 between the upper active region 241 and the lower active region 251, gate contact pads 208 and source contact pads 204 are disposed alternatingly in a GSG arrangement. Each gate contact pad 208 feeds a first plurality of gate fingers 210 in the upper active region 241 and a second plurality of gate fingers 210 in the lower active region 251. Solder bumps 224 are formed on the source contact pads 204 and solder bumps 228 are formed on the gate contact pads 208. Within the space 410, the solder bumps 224 and the solder bumps 228 are arranged alternatingly in a GSG arrangement.

Figure 10:
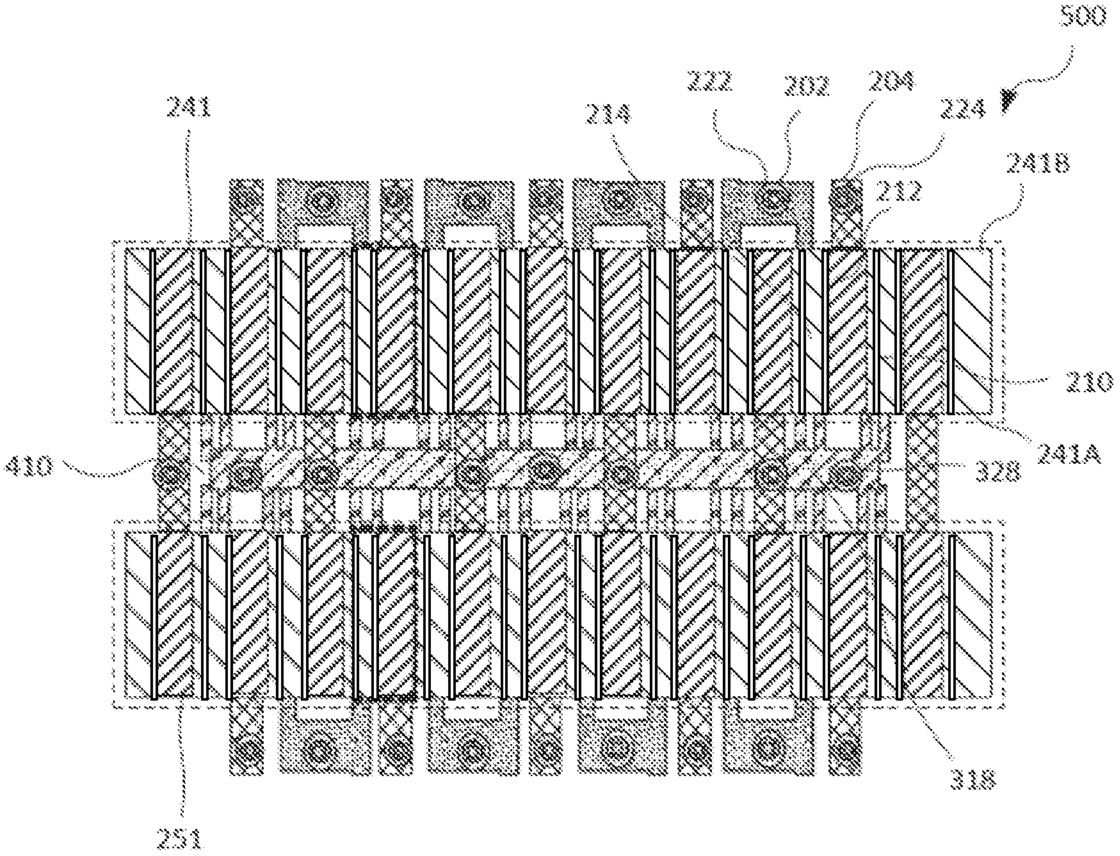

A metallization layout 500 of a transistor device structure according to further embodiments is illustrated in FIG. 10. The metallization layout 500 shown in FIG. 9 may be formed on a substrate 150 having a transistor device structure therein as illustrated, for example, in FIG. 4.

The layout 500 is similar to the layout 400 shown in FIG. 9, except that in the layout 500, the gate contact pads are replaced with a single gate contact strap 318 that extends through the space 410 between the upper active region 241 and the lower active region 251. The source contact pads 204 in the space 410 extend across the gate contact strap 318. Solder bumps 224 are formed on the source contact pads 204 and solder bumps 328 are formed on the gate contact strap 318. Within the space 410, the solder bumps 224 and the solder bumps 328 are arranged alternatingly in a GSG arrangement.

Figure 11:
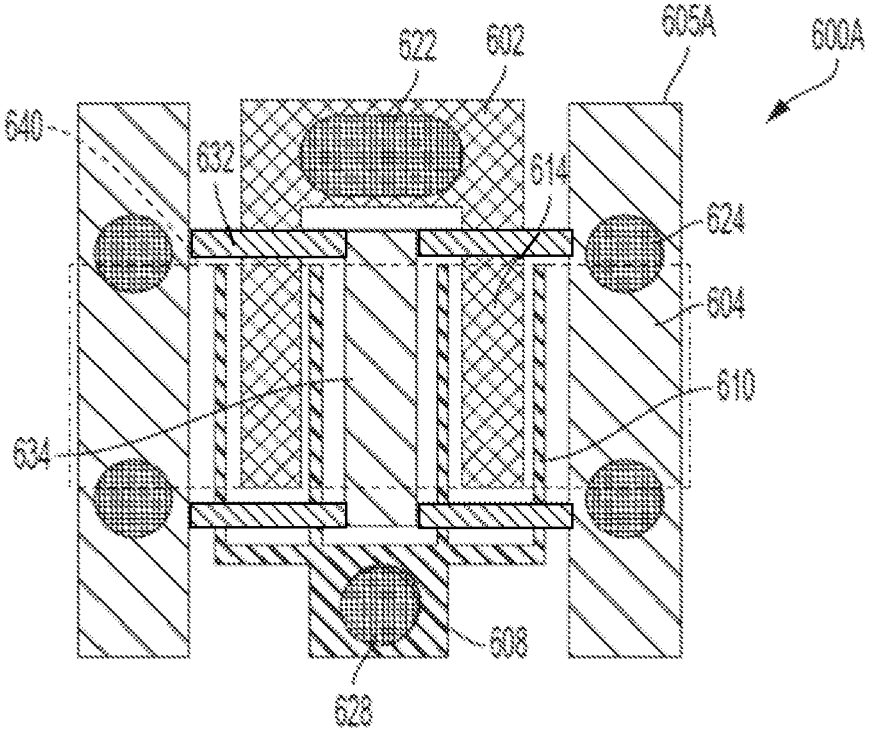

FIG. 11 is a metallization layout 600A for a unit cell 605A of a transistor device according to some embodiments. The metallization layout 600A shown in FIG. 11 may be formed on a substrate 150 having a transistor device structure therein as illustrated, for example, in FIG. 4.

The unit cell 605A includes a pair of outer source contacts 604 and an inner source contact 634 between the outer source contacts 604. The inner source contact 634 is conductively connected to the outer source contacts 604 by one or more source contact straps 632 that run laterally across the unit cell.

A drain contact 602 is disposed on a first side of the unit cell 605A and is conductively connected to a pair of drain contacts 614 that extend respectively between the outer source contacts 604 and the inner source contact 634. A gate contact 608 is disposed opposite the drain contact 602 on the other side of the unit cell 605A and is conductively connected to four gate fingers 610 that extend between respective pairs of source contacts 604, 634 and drain contacts 614. An active region 640 is defined within the unit cell 605A by the extent of vertical overlap of the gate fingers 610 with the drain contacts 614.

Solder bumps 624 are formed on the outer source contacts 604. Solder bumps 622 are formed on the drain contact 602, and solder bumps 628 are formed on the gate contact 608. On a first side of the unit cell 605A, the solder bumps 622 and 624 are arranged in a GSG arrangement, and on the other side of the unit cell 605A, the solder bumps 624 and 628 are arranged in a GSG arrangement.

Figure 12:
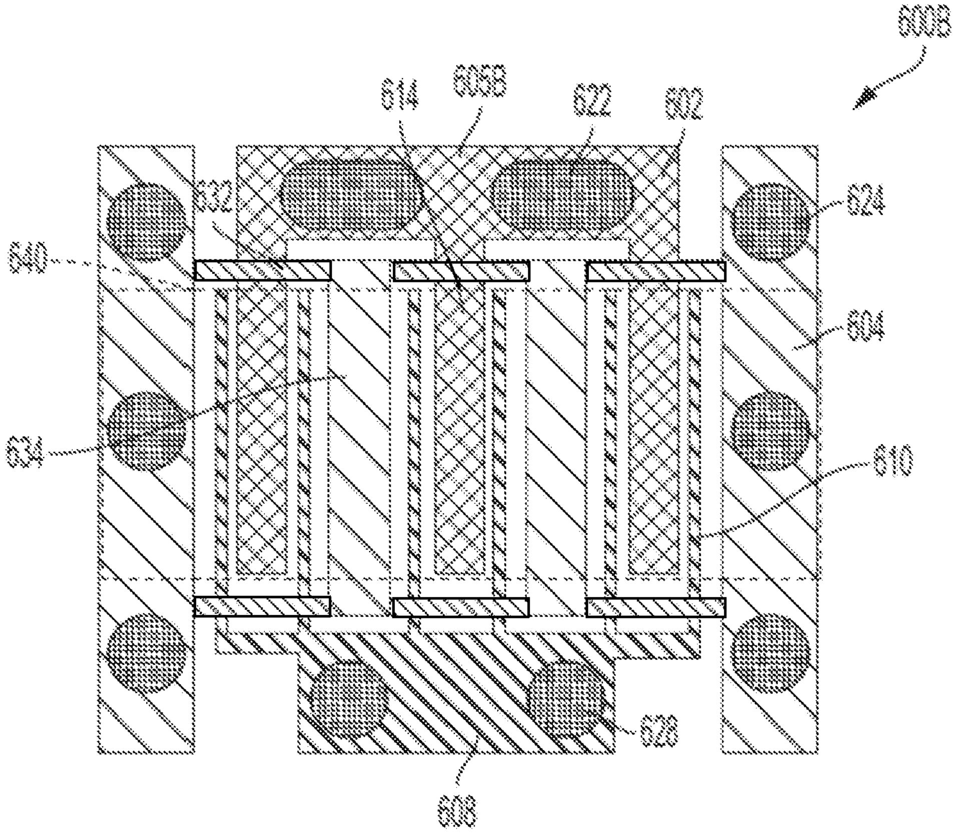

FIG. 12 is a metallization layout for a unit cell 605B of a transistor device according to some embodiments. The unit cell 605B is similar to the unit cell 605A shown in FIG. 11, except that the unit cell 605B includes two inner source contacts 634, three drain contacts 614 and six gate fingers 610. In the embodiment illustrated in FIG. 12, there are two solder bumps 628 on the gate contact 608 and two solder bumps 622 on the drain contact 602. Accordingly, on a first side of the unit cell 605B, the solder bumps 624 and 628 are arranged in a quasi-GSG arrangement in which the solder bumps 628 on the gate contact 608 are disposed between solder bumps 622 on the outer source contacts 604, and on the other side of the unit cell 605B, the solder bumps 622 and 624 are arranged in a quasi-GSG arrangement in which the solder bumps 622 on the drain contact 602 are disposed between solder bumps 624 on the outer source contacts 604.

Figure 13:
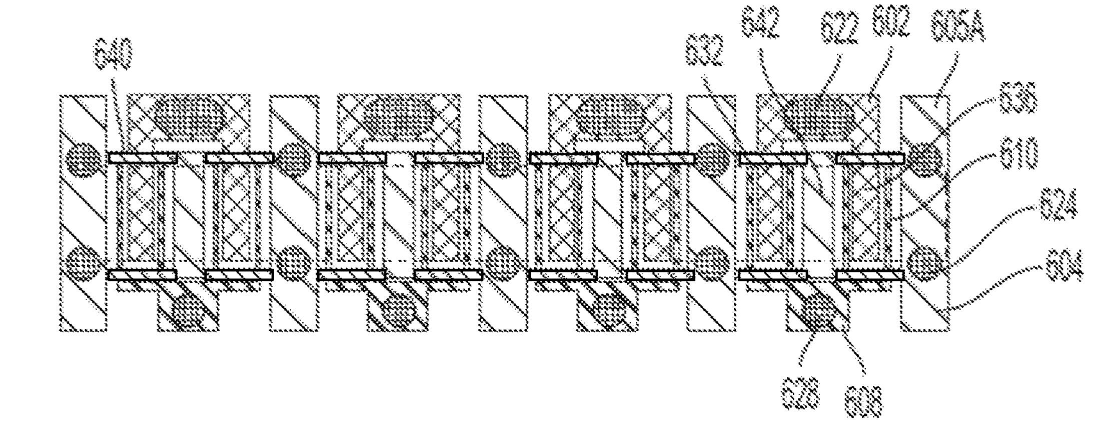
Figure 14:
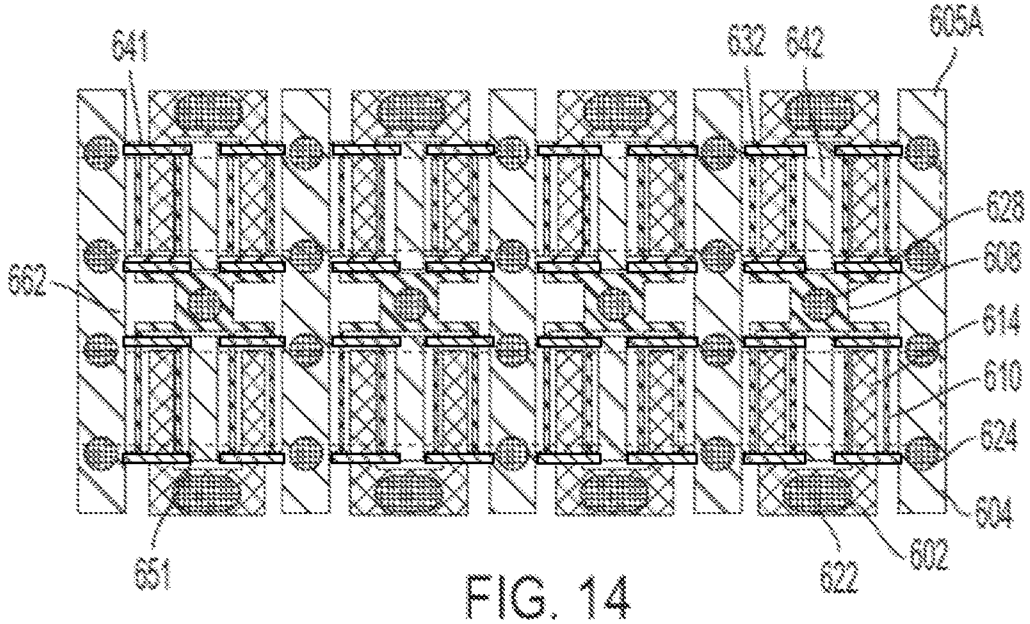
Figure 15:
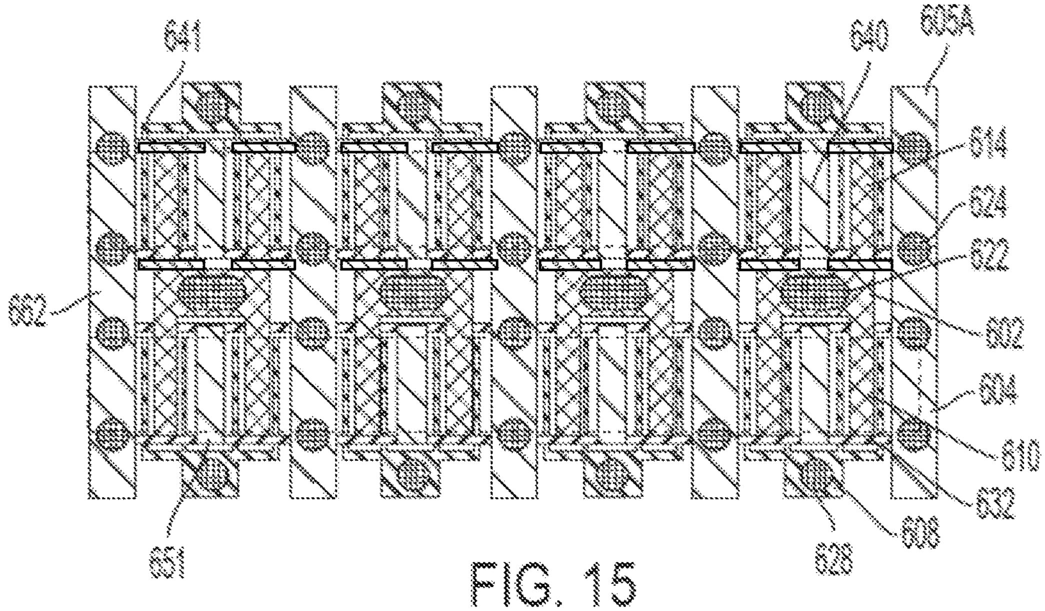

FIGS. 13, 14, and 15 illustrate various options for combining the unit cell 605A. For example, in FIG. 13, a plurality of unit cells 605A are arranged side by side to form an arrangement having a single active region 640. A similar arrangement may be formed using the unit cell 605B.

In FIG. 14, a plurality of unit cells 605A are arranged side by side to form an arrangement having an upper active region 641 and a lower active region 651 in which the gate contacts 604 are disposed within a space 662 between the upper active region 641 and the lower active region 651 and shared between unit cells in the upper active region 641 and the lower active region 651. The drain contacts 602 are disposed on outer sides of the arrangement.

In FIG. 15, a plurality of unit cells 605A are arranged side by side to form an arrangement having an upper active region 641 and a lower active region 651 in which the drain contacts 602 are disposed within the space 662 between the upper active region 641 and the lower active region 651 and shared between unit cells in the upper active region 641 and the lower active region 651. The gate contacts 608 are disposed on outer sides of the arrangement.

Transistor devices as described herein may be used in amplifiers that operate in a wide variety of different frequency bands. In some embodiments, the RF transistor amplifiers incorporating transistor devices as described herein may be configured to operate at frequencies greater than 1 GHz. In other embodiments, the RF transistor amplifiers may be configured to operate at frequencies greater than 2.5 GHZ. In still other embodiments, the RF transistor amplifiers may be configured to operate at frequencies greater than 3.1 GHZ. In yet additional embodiments, the RF transistor amplifiers may be configured to operate at frequencies greater than 5 GHZ. In some embodiments, the RF transistor amplifiers may be configured to operate in at least one of the 2.5-2.7 GHZ, 3.4-4.2 GHZ, 5.1-5.8 GHZ, 12-18 GHZ, 18-27 GHZ, 27-40 GHz or 40-75 GHz frequency bands or sub-portions thereof.

Although embodiments of the inventive concepts have been discussed above with respect to HEMT devices, it will be understood that the inventive concepts described herein may be applied to other types of semiconductor devices, such as MOSFETs, DMOS transistors, and/or laterally diffused MOS (LDMOS) transistors.

RF transistor amplifiers incorporating transistor devices described herein can be used in standalone RF transistor amplifiers and/or in multiple RF transistor amplifiers. Examples of how the RF transistor amplifiers according to some embodiments may be used in applications that include multiple amplifiers will be discussed with reference to FIGS. 16A-16C.

Figure 16A:
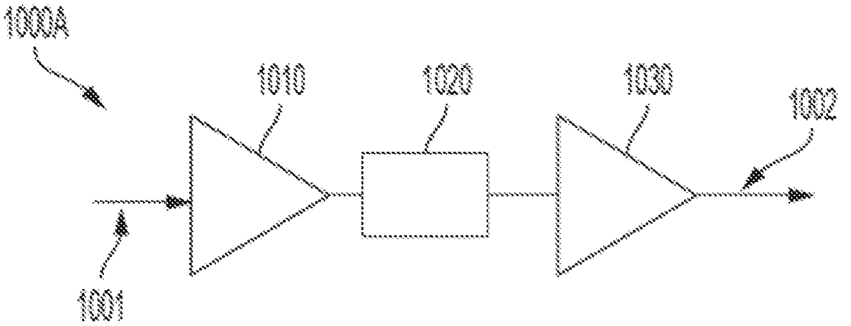
FIGS. 16A-16C are schematic block diagrams of multi-amplifier circuits in which RF transistor amplifiers incorporating transistor devices according to embodiments may be used.

Referring to FIG. 16A, an RF transistor amplifier 1000A is schematically illustrated that includes a pre-amplifier 1010 and a main amplifier 1030 that are conductively connected in series. As shown in FIG. 16A, RF transistor amplifier 1000A includes an RF input 1001, the pre-amplifier 1010, an inter-stage impedance matching network 1020, the main amplifier 1030, and an RF output 1002. The inter-stage impedance matching network 1020 may include, for example, inductors and/or capacitors arranged in any appropriate configuration in order to form a circuit that improves the impedance match between the output of pre-amplifier 1010 and the input of main amplifier 1030. While not shown in FIG. 16A, RF transistor amplifier 1000A may further include an input matching network that is interposed between RF input 1001 and pre-amplifier 1010, and/or an output matching network that is interposed between the main amplifier 1030 and the RF output 1002. The RF transistor amplifiers according to embodiments may be used to implement either or both of the pre-amplifier 1010 and the main amplifier 1030.

Figure 16B:
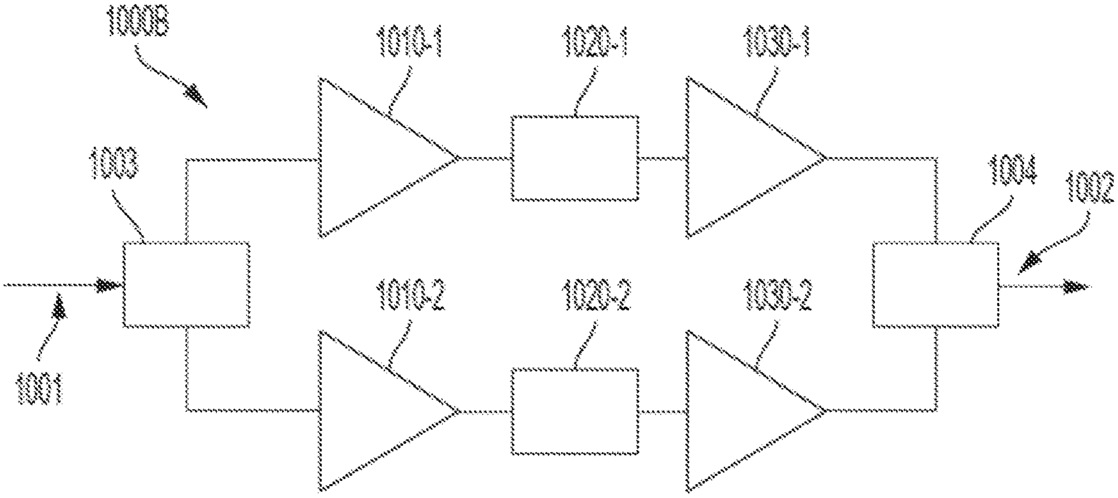

Referring to FIG. 16B, an RF transistor amplifier 1000B is schematically illustrated that includes an RF input 1001, a pair of pre-amplifiers 1010-1, 1010-2, a pair of inter-stage impedance matching networks 1020-1, 1020-2, a pair of main amplifiers 1030-1, 1030-2, and an RF output 1002. A splitter 1003 and a combiner 1004 are also provided. Pre-amplifier 1010-1 and main amplifier 1030-1 (which are electrically connected in series) are arranged electrically in parallel with pre-amplifier 1010-2 and main amplifier 1030-2 (which are electrically connected in series). As with the RF transistor amplifier 1000A of FIG. 9A, RF transistor amplifier 1000B may further include an input matching network that is interposed between RF input 1001 and pre-amplifiers 1010-1, 1010-2, and/or an output matching network that is interposed between the main amplifiers 1030-1, 1030-2 and the RF output 1002.

Figure 16C:
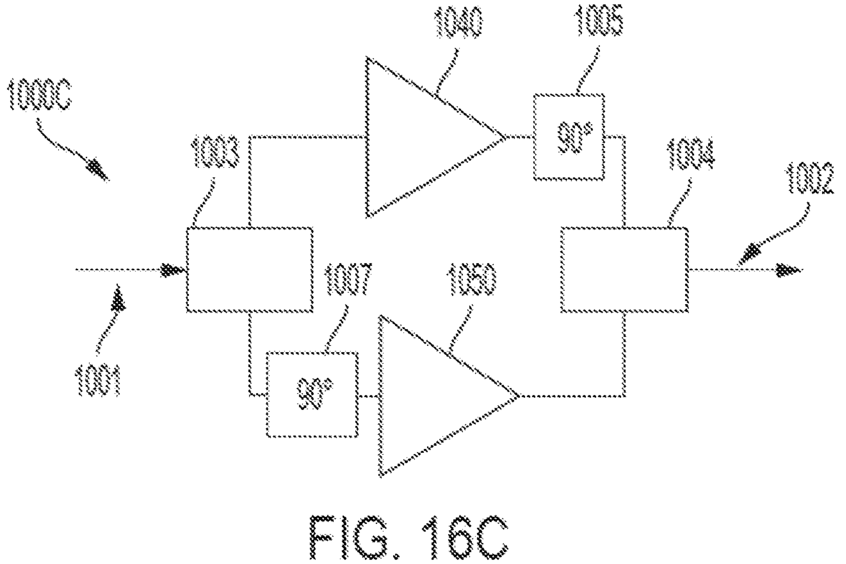

As shown in FIG. 16C, the RF transistor amplifiers according to some embodiments may also be used to implement Doherty amplifiers. As is known in the art, a Doherty amplifier circuit includes first and second (or more) power-combined amplifiers. The first amplifier is referred to as the “main” or “carrier” amplifier and the second amplifier is referred to as the “peaking” amplifier. The two amplifiers may be biased differently. For example, the main amplifier may comprise a Class AB or a Class B amplifier while the peaking amplifier may be a Class C amplifier in one common Doherty amplifier implementation. The Doherty amplifier may operate more efficiently than balanced amplifiers when operating at power levels that are backed off from saturation. An RF signal input to a Doherty amplifier is split (e.g., using a quadrature coupler), and the outputs of the two amplifiers are combined. The main amplifier is configured to turn on first (i.e., at lower input power levels) and hence only the main amplifier will operate at lower power levels. As the input power level is increased towards saturation, the peaking amplifier turns on and the input RF signal is split between the main and peaking amplifiers.

As shown in FIG. 16C, the Doherty RF transistor amplifier 1000C includes an RF input 1001, an input splitter 1003, a main amplifier 1040, a peaking amplifier 1050, an output combiner 1004 and an RF output 1002. The Doherty RF transistor amplifier 1000C includes a 90° transformer 1007 at the input of the peaking amplifier 1050 and a 90° transformer 1005 at the input of the main amplifier 1040, and may optionally include input matching networks and/or an output matching networks (not shown). The main amplifier 1040 and/or the peaking amplifier 1050 may be implemented using any of the above-described RF transistor amplifiers according to embodiments.

The RF transistor amplifiers according to embodiments may be formed as discrete devices, or may be formed as part of a Monolithic Microwave Integrated Circuit (MMIC). A MMIC refers to an integrated circuit that operates on radio and/or microwave frequency signals in which all of the circuitry for a particular function is integrated into a single semiconductor chip. An example MMIC device is a transistor amplifier that includes associated matching circuits, feed networks and the like that are all implemented on a common substrate. MMIC transistor amplifiers typically include a plurality of unit cell HEMT transistors that are connected in parallel.

It is understood that, although the ordinal terms first, second, third, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Furthermore, relative terms, such as “lower” or “bottom” and “upper” or “top,” may be used herein to describe the relationship of one element to another as illustrated in the drawings. It is understood that relative terms are intended to encompass different orientations of the device in addition to the orientation depicted in the drawings. For example, if the device in one of the drawings is turned over, features described as being on the “lower” side of an element would then be oriented on “upper” side of that element. The exemplary term “lower” can therefore describe both lower and upper orientations, depending of the particular orientation of the device. Similarly, if the device in one of the drawings is turned over, elements described as “below” or “beneath” other elements would then be oriented above those other elements. The exemplary terms “below” or “beneath” can therefore describe both an orientation of above and below.

The terminology used in the description of the disclosure herein is for the purpose of describing particular embodiments only and is not intended to be limiting of the disclosure. As used in the description of the disclosure and the appended claims, the singular forms “an” and “the” are intended to include the plural forms as well, unless the context clearly indicates otherwise. It is also understood that the term “and/or” as used herein refers to and encompasses any and all possible combinations of one or more of the associated listed items. It will be further understood that the terms “comprises” and “comprising,” when used in this specification, specify the presence of stated steps, operations, features, elements, and/or components, but do not preclude the presence or addition of one or more other steps, operations, features, elements, components, and/or groups thereof.

Embodiments of the disclosure are described herein with reference to cross-section illustrations that are schematic illustrations of idealized embodiments of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. The regions illustrated in the drawings are schematic in nature, and their shapes are not intended to illustrate the actual shape of a region of a device and are not intended to limit the scope of the disclosure unless explicitly stated otherwise. Further, lines that appear straight, horizontal, or vertical in the below drawings for schematic reasons will often be sloped, curved, non-horizontal, or non-vertical. Further, while the thicknesses of elements are meant to be schematic in nature.

Unless otherwise defined, all terms used in disclosing embodiments of the disclosure, including technical and scientific terms, have the same meaning as commonly understood by one of ordinary skill in the pertinent art and are not necessarily limited to the specific definitions known at the time of the present disclosure. Accordingly, these terms can include equivalent terms that are created after such time. It is further understood that terms, such as those defined in commonly used dictionaries, should be interpreted as having a meaning that is consistent with their meaning in the present specification and in the context of the relevant art.

Although embodiments of the inventive concepts have been described in considerable detail with reference to certain configurations thereof, other versions are possible. The field plates and gates can also have many different shapes and can be connected to the source contact in many different ways. Accordingly, the spirit and scope of the invention should not be limited to the specific embodiments described above.

What is claimed is:

1. A transistor device, comprising:

a substrate;

a plurality of transistor unit cells arranged in parallel on the substrate, wherein each of the transistor unit cells comprises a source contact, a drain contact, and a gate finger between the source contact and the drain contact, wherein the gate finger extends in a first direction and has a first end and a second end;

wherein the source contacts, the drain contacts and the gate fingers of the plurality of unit cells define an active region of the transistor device in a portion of the substrate where the source contacts, the drain contacts and the gate fingers overlap in the first direction;

a first solder bump on the transistor device, wherein the first solder bump is electrically connected to the gate finger of a first one of the unit cells at a feed point that is between the first end and the second end of the gate finger; and a gate strap that extends in a second direction that is perpendicular to the first direction, wherein the gate strap extends across a source contact of the first one of the unit cells adjacent the gate finger of the first one of the unit cells and is insulated from the source contact, wherein the first solder bump is formed on the gate strap.

2. The transistor device of claim 1, further comprising:

a source contact pad on the substrate adjacent a first side of the active region;

a drain contact pad on the substrate adjacent a second side the active region opposite the first side of the active region;

a second solder bump on the source contact pad; and a third solder bump on the drain contact pad.

3. The transistor device of claim 1, wherein the first solder bump is connected to the gate finger via a first metal interconnect layer between the gate finger and the first solder bump.

4. The transistor device of claim 1, further comprising a first plurality of solder bumps on the transistor device, wherein the first plurality of solder bumps are within the periphery of the active region and are electrically connected to gate fingers of respective ones of the plurality of transistor unit cells.

5. The transistor device of claim 1, wherein the first solder bump is directly above the gate finger.

6. The transistor device of claim 1, wherein the transistor device is configured to be flip-chip mounted to a submount having a contact bond pad region that contacts the first solder bump.

7. The transistor device of claim 6, wherein an input signal is propagated along the contact bond pad region to the first solder bump via the gate strap.

* * * * *